US009954532B2

(12) United States Patent
Oda

(10) Patent No.: US 9,954,532 B2
(45) Date of Patent: Apr. 24, 2018

(54) INTEGRATED CIRCUIT AND ELECTRONIC DEVICE

(71) Applicant: Kabushiki Kaisha Toshiba, Minato-ku (JP)

(72) Inventor: Masato Oda, Sagamihara (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/260,806

(22) Filed: Sep. 9, 2016

(65) Prior Publication Data
US 2017/0272078 A1    Sep. 21, 2017

(30) Foreign Application Priority Data
Mar. 17, 2016  (JP) .................. 2016-054130

(51) Int. Cl.
*H03K 19/177*  (2006.01)
*H03K 19/173*  (2006.01)

(52) U.S. Cl.
CPC ... *H03K 19/17728* (2013.01); *H03K 19/1737* (2013.01); *H03K 19/17748* (2013.01)

(58) Field of Classification Search
None
See application file for complete search history.

(56) References Cited

U.S. PATENT DOCUMENTS

| 5,122,685 A | 6/1992 | Chan et al. |
| 6,326,808 B1 * | 12/2001 | Fisk ................ H03K 19/17712 326/39 |
| 6,339,341 B1 | 1/2002 | Fujii et al. |
| 6,594,810 B1 | 7/2003 | Reblewski et al. |
| 6,822,976 B1 * | 11/2004 | Riesenman ......... G06F 13/4027 326/38 |
| 7,256,613 B1 * | 8/2007 | Sharpe-Geisler ....................... H03K 19/17728 326/39 |
| 8,530,880 B2 | 9/2013 | Strukov et al. |
| 9,166,598 B1 * | 10/2015 | Lewis ................ G11C 13/0002 |

(Continued)

FOREIGN PATENT DOCUMENTS

| JP | 3269526 B2 | 1/2002 |
| JP | 4621424 B2 | 11/2010 |

*Primary Examiner* — Douglas W Owens
*Assistant Examiner* — James H Cho
(74) *Attorney, Agent, or Firm* — Oblon, McClelland, Maier & Neustadt, L.L.P.

(57) ABSTRACT

An integrated circuit according to an embodiment includes: a first block including a first logic block configured to perform a logical operation, a first switch block circuit configured to control connection and non-connection with the first logic block, and a second switch block circuit configured to control connection and non-connection with the first logic block; and a second block including a second logic block configured to perform a logical operation, a third switch block circuit configured to control connection and non-connection with the second logic block, and a fourth switch block circuit configured to control connection and non-connection with the second logic block, wherein the first switch block circuit is mutually connected with the third and fourth switch block circuits, and the second switch block circuit is mutually connected with the third and fourth switch block circuits.

8 Claims, 17 Drawing Sheets

(56) References Cited

U.S. PATENT DOCUMENTS

2016/0065217 A1* 3/2016 Oikawa .............. H03K 19/1733
    326/38
2016/0173103 A1* 6/2016 Gao ................... H03K 19/1776
    326/39

* cited by examiner

INTEGRATED CIRCUIT AND ELECTRONIC DEVICE

CROSS REFERENCE TO RELATED APPLICATIONS

This application is based upon and claims the benefit of priority from prior Japanese Patent Application No. 2016-054130 filed on Mar. 17, 2016 in Japan, the entire contents of which are incorporated herein by reference.

FIELD

Embodiments described herein relate generally to an integrated circuit and an electronic device.

BACKGROUND

A field programmable gate array (FPGA) is an integrated circuit that can realize an arbitrary logical function. The FPGA includes a logic block that performs a basic logical operation, and a switch block that switches connection of wiring lines between logic blocks.

The switch block has a function as a multiplexer circuit (hereinafter, also referred to as MUX circuit). The MUX circuit has a function of selecting one of connected inputs and connecting the input to an output. Outputs of the switch block include a plurality of multiplexer circuits. A switch block in which all inputs can be arbitrarily connected to all outputs is known. This switch block is called a crosspoint switch block.

As described later, there is a problem that a signal is delayed and a chip area is increased in the crosspoint switch block.

DETAILED DESCRIPTION

An integrated circuit according to an embodiment includes: a first block including a first logic block configured to perform a logical operation, a first switch block circuit configured to control connection and non-connection with the first logic block, and a second switch block circuit configured to control connection and non-connection with the first logic block; and a second block including a second logic block configured to perform a logical operation, a third switch block circuit configured to control connection and non-connection with the second logic block, and a fourth switch block circuit configured to control connection and non-connection with the second logic block, wherein the first switch block circuit is mutually connected with the third and fourth switch block circuits, and the second switch block circuit is mutually connected with the third and fourth switch block circuits.

Before a description of embodiments of the present invention, how the present invention is invented will be described.

Figure 1:
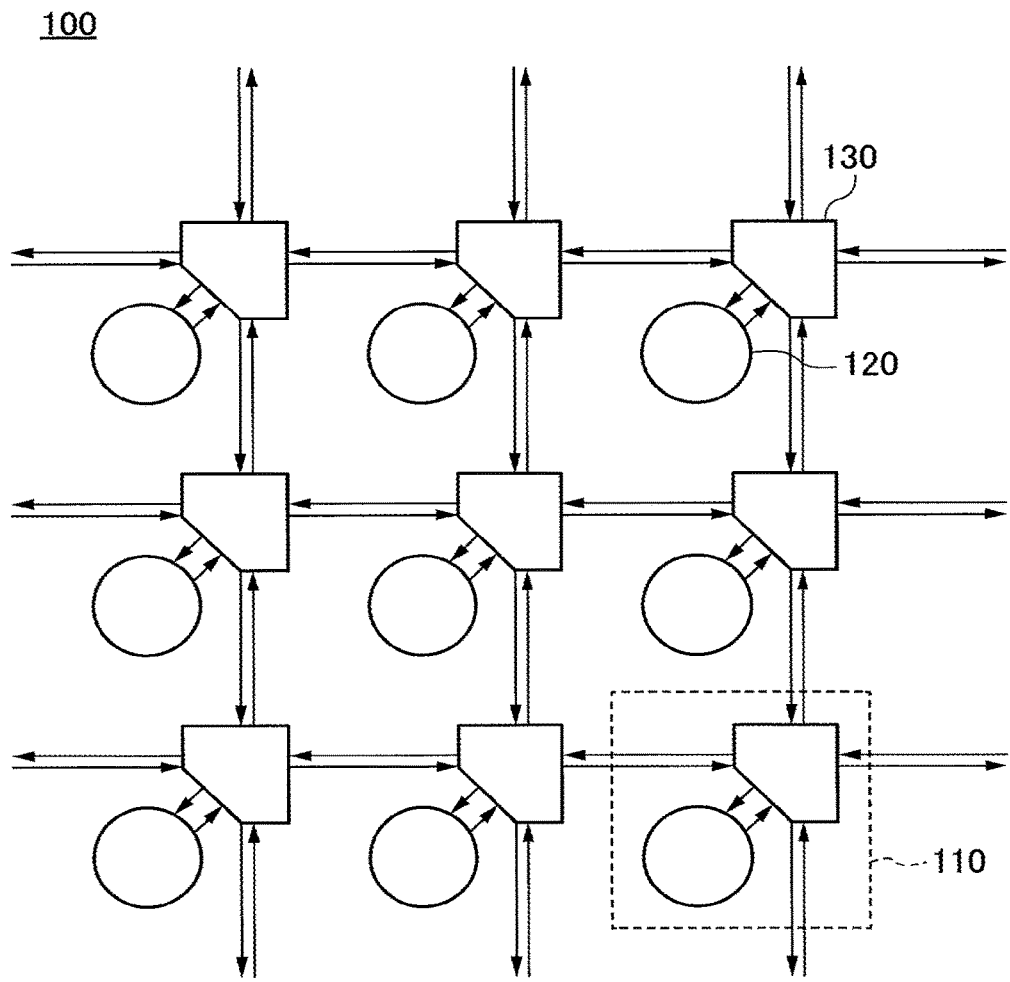
FIG. 1 is a block diagram showing a configuration of an FPGA.

First, a configuration of a general FPGA will be described. As illustrated in FIG. 1, an FPGA 100 generally includes a plurality of basic blocks 110 arranged in an array. Each basic block 110 is connected to adjacent basic blocks 110 with wiring lines. Each basic block 110 includes a logic block 120 and a switch block 130. The logic block 120 is a block that performs a logical operation and a basic configuration thereof is performed with a look-up table including a truth table. Each switch block 130 controls connection/non-connection of a wiring line connected to an adjacent basic block 110 and makes it possible to transmit a signal in an arbitrary direction.

Also, each switch block 130 makes connection with the logic block 120. Each of the logic block 120 and the switch block 130 can control connection based on data stored in a configuration memory thereof.

Figure 2:
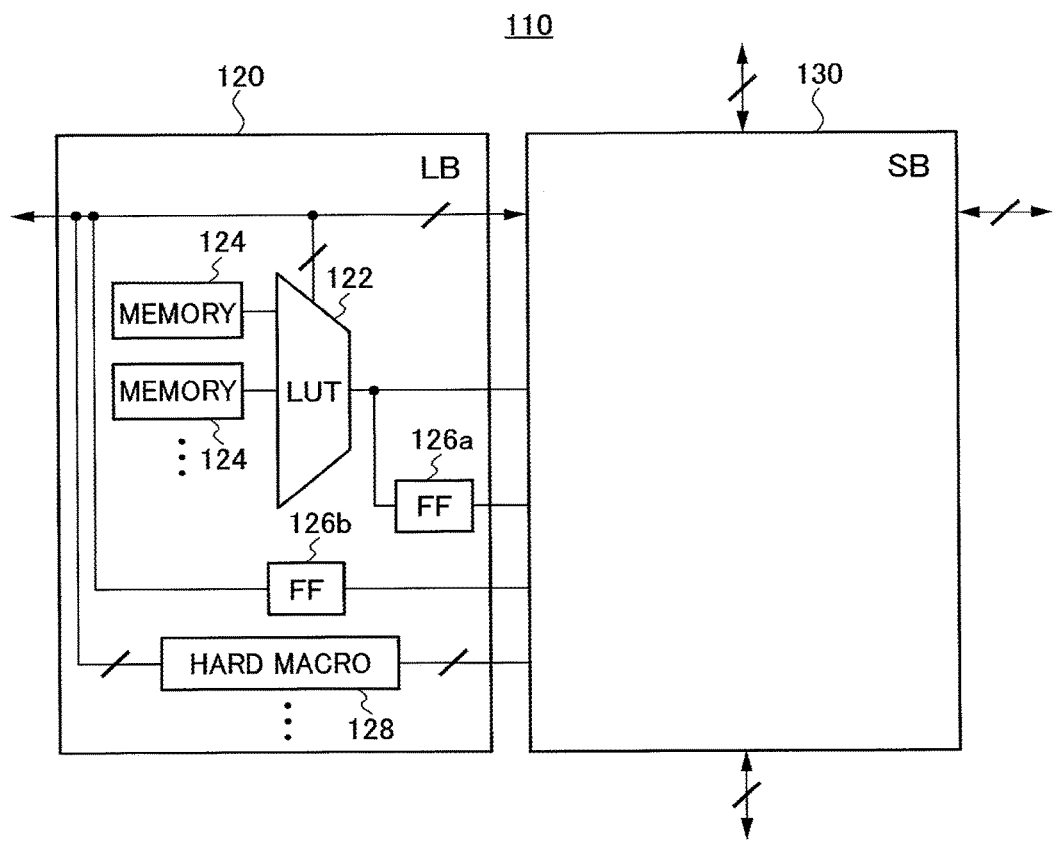
FIG. 2 is a block diagram showing an example of a configuration of a logic block.

As illustrated in FIG. 2, each logic block 120 includes a look-up table circuit 122 (hereinafter, also referred to as LUT circuit 122) and a memory 124. The LUT circuit 122 outputs information stored in the memory 124 according to inputs. By rewriting the information stored in the memory 124, it is possible to implement an arbitrary function in the LUT circuit 122.

Figure 3A:
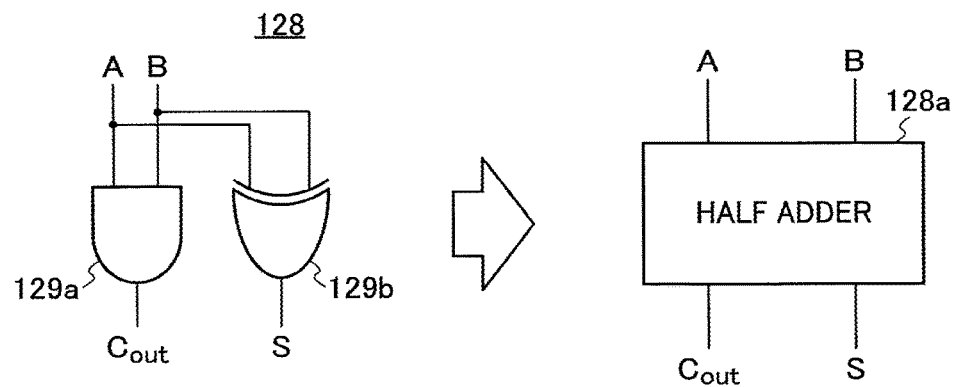
FIG. 3A is a diagram showing an example of a hard macro.
Figure 3B:
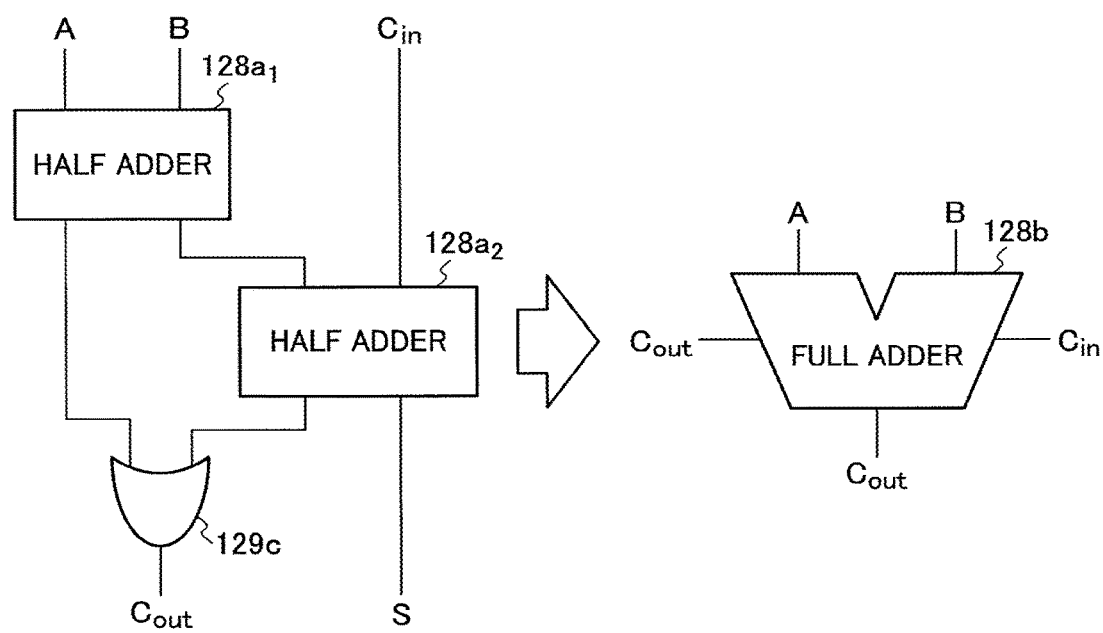
FIG. 3B is a diagram showing a different example of a hard macro.

Moreover, the logic block 120 may include flip-flop circuits 126a and 126b and a hard macro 128. The flip-flop circuit 126a is connected to an output terminal of the LUT circuit 122 and the flip-flop circuit 126b is directly connected to an input terminal of the logic block 120. Here, the hard macro 128 is a previously-designed circuit group. For example, as illustrated in FIG. 3A, as an example of the hard macro 128, there is a half adder 128a including an AND gate 129a and an XOR gate 129b. Also, as a different example, there is a full adder 128b including half adders $128a_1$ and $128a_2$, and an OR gate 129c.

Figure 4:
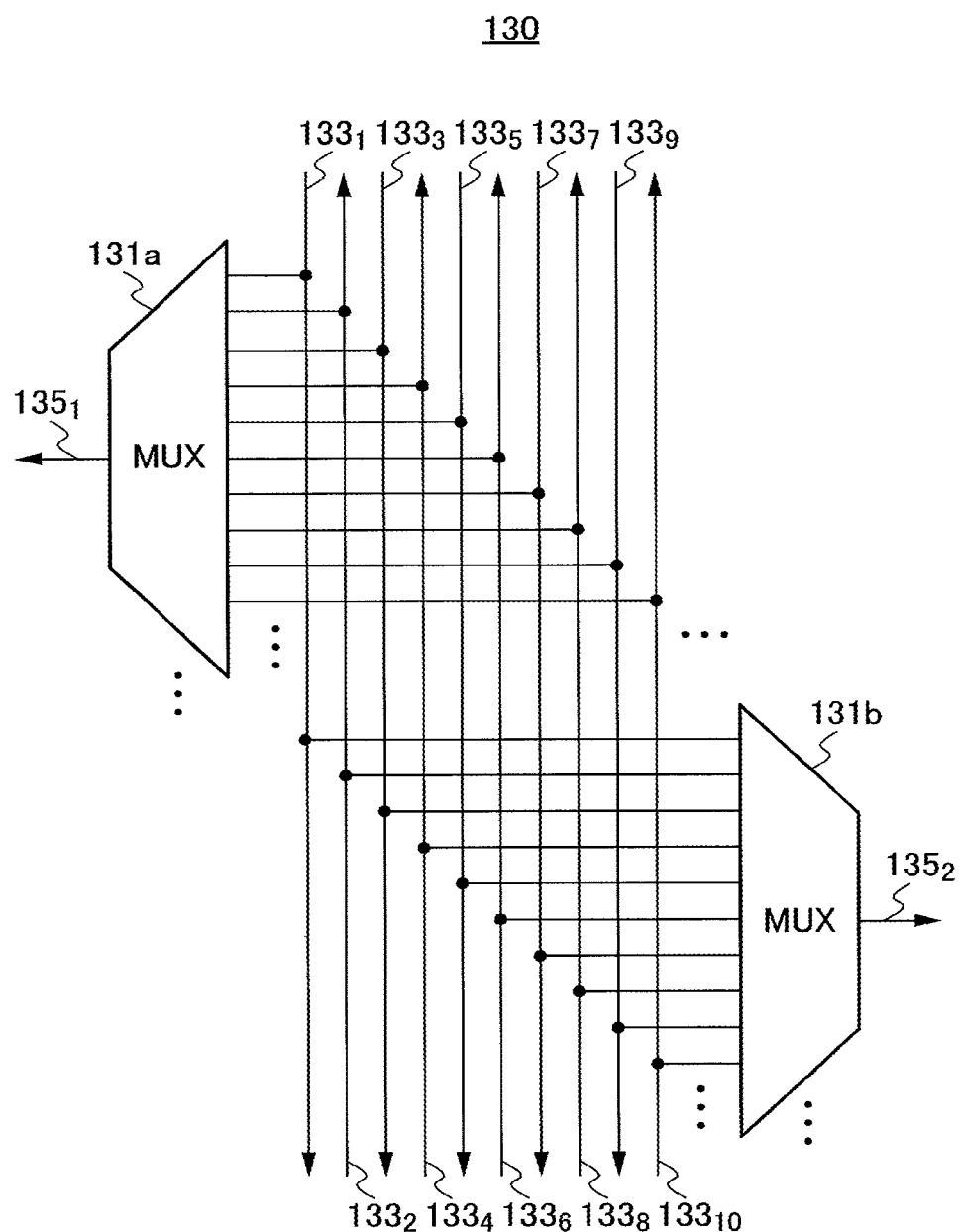
FIG. 4 is a diagram showing an example of a switch block including an MUX.

Each switch block 130 includes a plurality of multiplexer circuits (hereinafter, also referred to as MUX circuit). An example of the switch block 130 is illustrated in FIG. 4. This switch block 130 includes two MUX circuits 131a and 131b. Each of these MUX circuits 131a and 131b has a function of selecting one of a plurality of input terminals connected to a plurality of wiring lines $133_1$ to $133_{10}$ and connecting the selected input terminal to an output terminal connected to a wiring line $135_1$ or $135_2$. In such a manner, the switch block 130 includes a plurality of output terminals.

Figure 5:
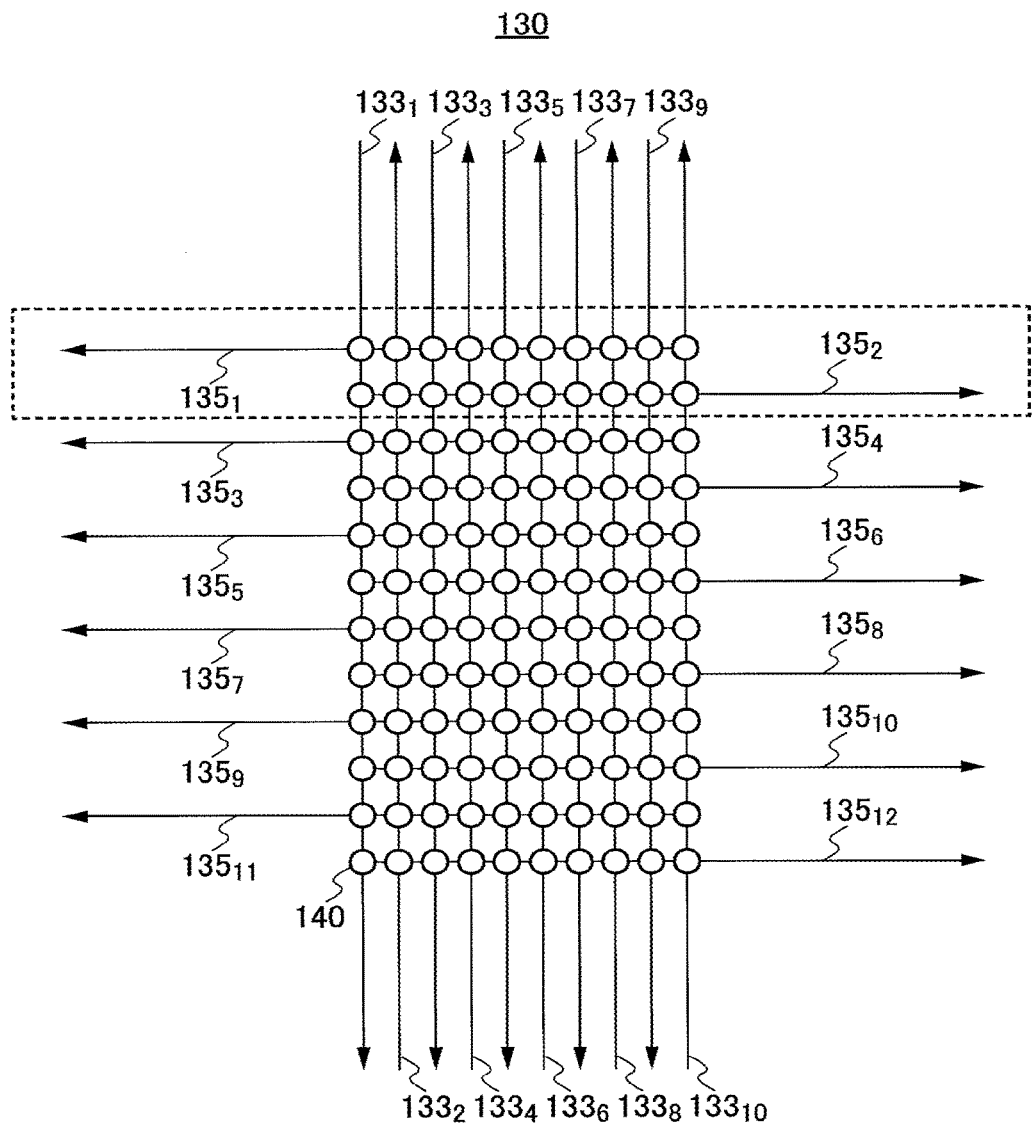
FIG. 5 is a diagram showing an example of a crosspoint switch block.

A switch block 130 of a different example is illustrated in FIG. 5. The switch block 130 illustrated in FIG. 5 includes switching circuits 140 arrayed in a matrix. The switching circuits 140 arranged in the same row are connected to one output wiring line. For example, in FIG. 5, a plurality of switching circuits 140 arrayed in the (2i−1)-th (i=1, ..., 6) row from the top is connected to a wiring line $135_{2i-1}$ in which a signal is output to the left and a plurality of switching circuits 140 arrayed in the 2ith row is connected to a wiring line $135_{2i}$ in which a signal is output to the right. Also, switching circuits 140 arranged in the (2j−1)-th (j=1, ..., 5) line from the left are connected to the wiring line $133_{2j-1}$ and switching circuits 140 arranged in the 2jth line are connected to the wiring line $133_{2j}$. That is, the switching circuits 140 are provided in a cross region of the wiring lines $133_1$ to $133_{10}$ and the wiring lines $135_1$ to $135_{12}$. Each switching circuit 140 determines whether there is connection with one corresponding wiring line among the wiring lines $133_1$ to $133_{10}$ and with one corresponding wiring line among the wiring lines $135_1$ to $135_{12}$. Note that, for example, switching circuits 140 arrayed in the first row from the top and switching circuits 140 arrayed in the second row have a function identical to that of the MUX circuits 131a and 131b in FIG. 4.

In such a manner, all inputs in the switch block 130 illustrated in FIG. 5 can be arbitrarily connected to all outputs. A switch block which is arranged in such a manner in a cross region of wiring lines and wiring lines, which includes switching circuits, and in which all inputs can be arbitrarily connected to all outputs is called a crosspoint switch block.

Also, an MUX circuit using a CMOS transistor is known. However, since an increase of an area with respect to an increase of the number of inputs is large in this MUX circuit. Thus, there is a case where architecture in which inputs into all switch blocks are not input through the MUX circuit and are input while being thinned is employed.

For example, when one element among random access memories such as a magnetic tunnel junction (MTJ) element, a redox-type variable resistance element, an ion conduction-type variable resistance element, and a phase-change element, and an anti-fuse of a gate oxide film breaking-type or the like is used as a two-terminal switching element, it becomes possible to control an increase of an area.

Figure 6:
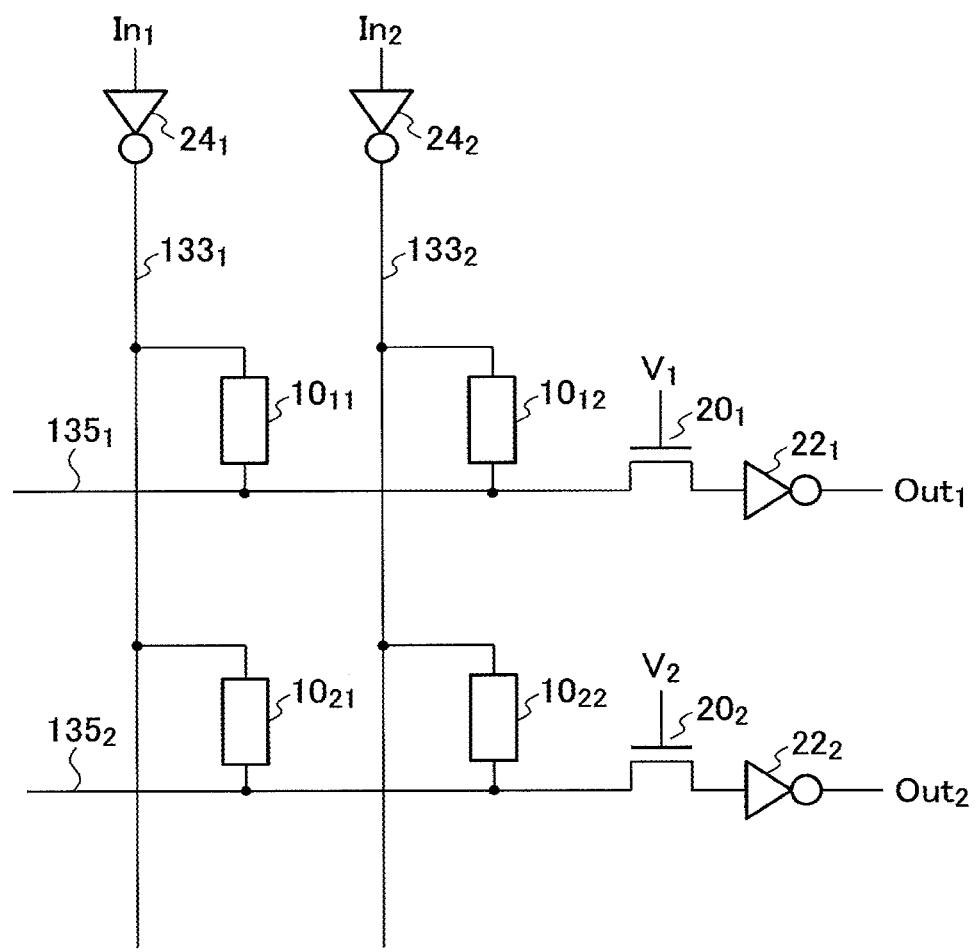
FIG. 6 is a diagram showing an example of a crosspoint switch block using a two-terminal switching element.

A detailed example of a crosspoint switch block in which a two-terminal switching element is used as a switching circuit is illustrated in FIG. 6. This switch block 130 includes a two-terminal switching element $10_{ij}$ (i, j=1, 2), input terminals $In_1$ and $In_2$ that make an input into inverters $24_1$ and $24_2$, and output terminals $Out_1$ and $Out_2$ that receive an output from inverters $22_1$ and $22_2$ through transistors $20_1$ and $20_2$. The input terminal $In_j$ (j=1, 2) is connected to the wiring line 133 through the inverter $24_j$. The output terminal $Out_i$ (i=1, 2) is connected to the wiring line $135_i$ through the inverter $22_i$ and the transistor $20_i$. Also, the two-terminal switching element $10_{ij}$ (i, j=1, 2) is provided in a cross region of the wiring line $133_j$ and the wiring line $135_i$, one of two terminals being connected to the wiring line $133_j$ and the other terminal being connected to the wiring line $135_i$.

Figure 7:
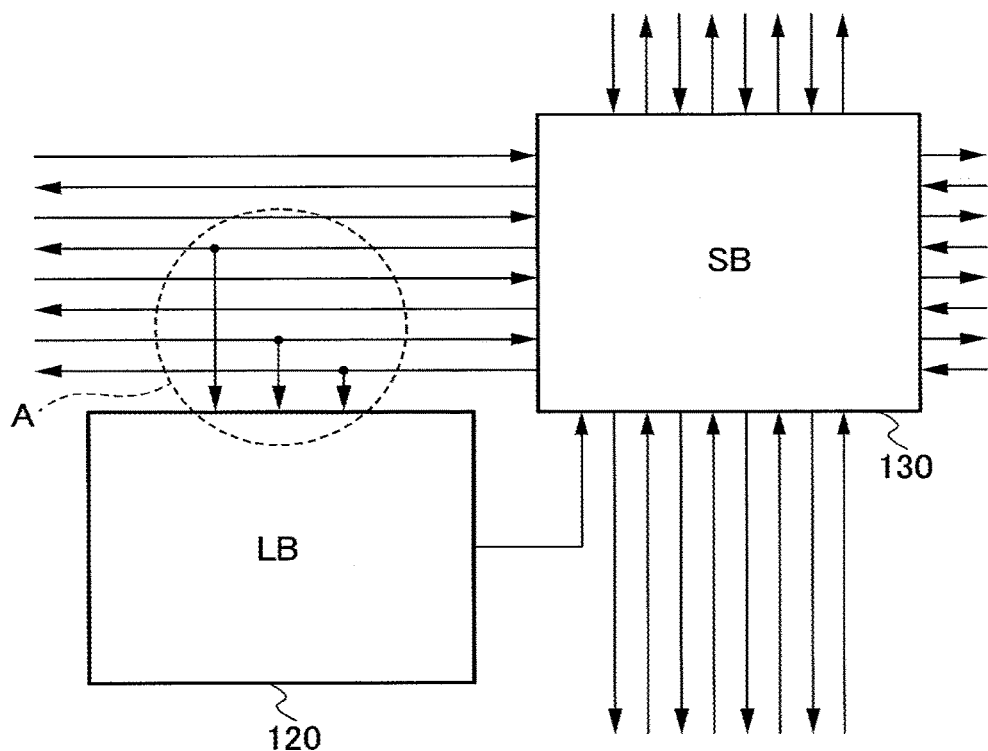
FIG. 7 is a block diagram showing a crosspoint switch block.

In such a manner, in a case where the crosspoint switch block is used, it is not necessary to provide a special input circuit for an input into a logic block. As illustrated in FIG. 7, a wiring line to connect an input wiring line or an output wiring line with an input terminal or an output terminal of a logic block 120 is provided.

Figure 8:
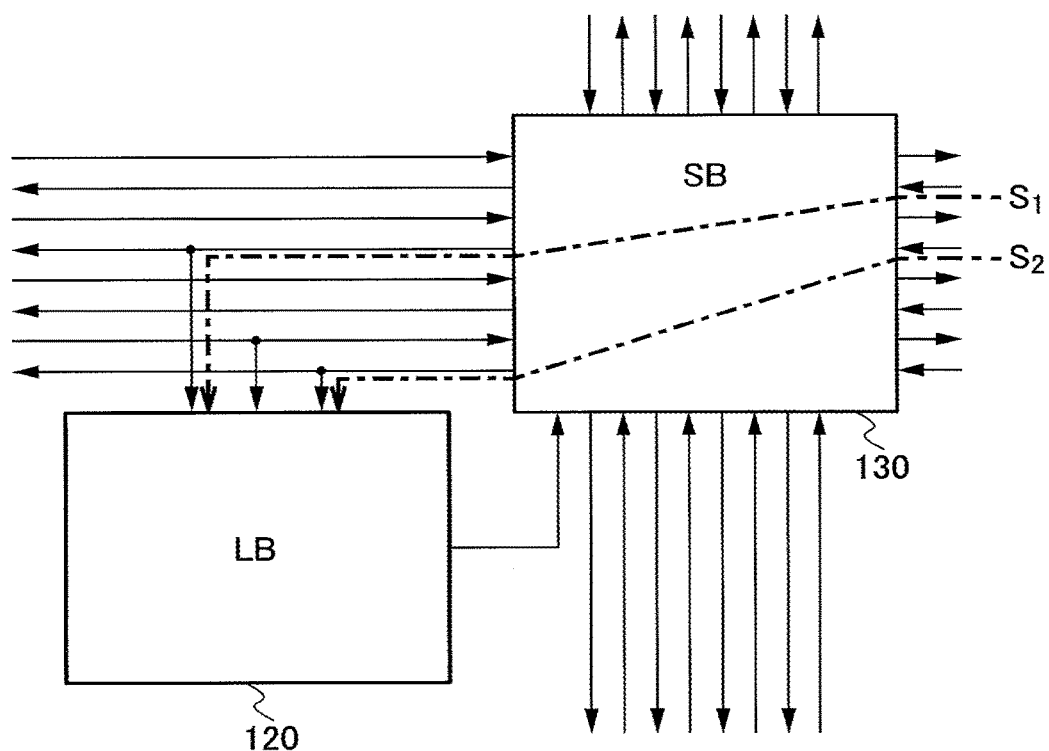
FIG. 8 is a diagram for explaining advantages of a crosspoint switch block.

This is because a switch block 130 can connect an arbitrary input into this switch block 130, such as an input S1 or S2 indicated by a broken line, to an arbitrary output, as illustrated in FIG. 8. That is, the switch block 130 has a configuration that also includes an input circuit.

As described above, when the crosspoint switch block is used, an MUX circuit for an input into a logic block is not necessary and a circuit configuration becomes simple.

However, there are great number of wiring resources in a recent FPGA. It is considered that the number of inputs/outputs is increased even in the crosspoint switch block. In this case, even when a two-terminal switching element is used and a chip area is decreased, a large delay may be generated due to accumulated element capacity.

Figure 9:
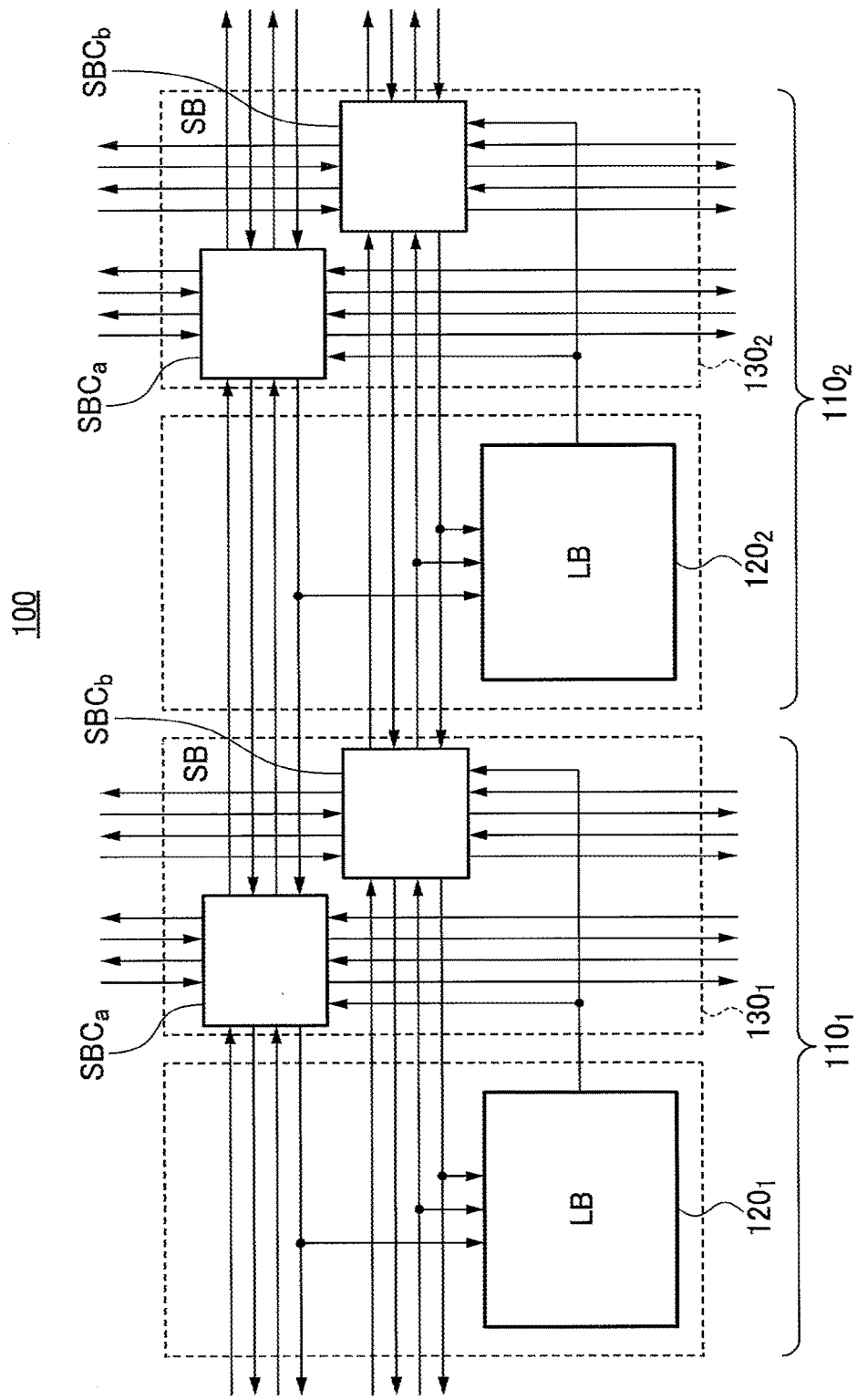
FIG. 9 is a diagram showing an example of an FPGA in a case where a crosspoint switch block is divided.

With respect to this delay, as illustrated in FIG. 9, an integrated circuit 100 in which each of the crosspoint switch blocks $130_1$ and $130_2$ is divided into a plurality of (two in FIG. 9) switch block circuits SBCa and SBCb is considered. In this integrated circuit 100, the switch block circuit SBCa of the switch block $130_2$ is connected to the switch block circuit SBCa of the switch block $130_1$ but is not connected to the switch block circuit SBCb. Also, similarly, the switch block circuit SBCb of the switch block $130_2$ is connected to the switch block circuit SBCb of the switch block $130_1$ but is not connected to the switch block circuit SBCa. Note that each of the divided switch block circuits includes a switching circuit including a plurality of switching elements $10_{11}$ to $10_{22}$ arrayed in a matrix, for example, as illustrated in FIG. 6.

With such a configuration, the number of connected elements is decreased and it is possible to decrease a pass delay.

Figure 10:
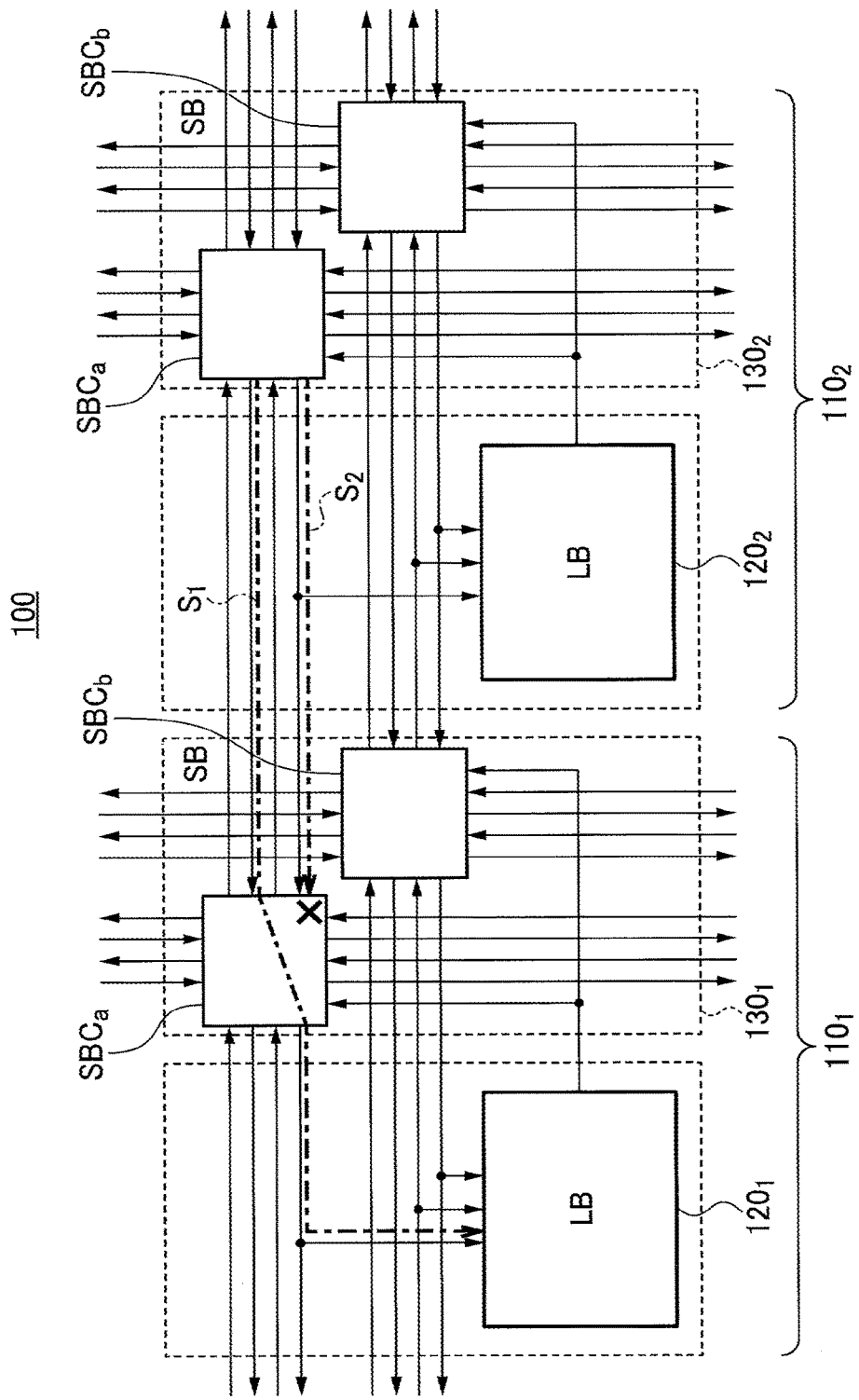
FIG. 10 is a diagram for explaining a problem of the FPGA illustrated in FIG. 9.

However, in this case, as illustrated in FIG. 10, there is a condition in which it is not possible to input an input S2 from the switch block $130_2$ into the logic block $120_1$. That is, in an FPGA illustrated in FIG. 10, a condition in which it is not possible to use all inputs from a switch block effectively.

Thus, it is not possible to use the FPGA, which is illustrated in FIG. 10, as an FPGA with many wiring resources since the number of usable wiring lines is decreased.

Thus, the present inventors have made effort on a research and have acquired an integrated circuit that can control a delay of a signal and an increase of a chip area even when being used in an FPGA with many wiring resources. This integrated circuit will be described as an embodiment in the following.

First Embodiment

Figure 11:
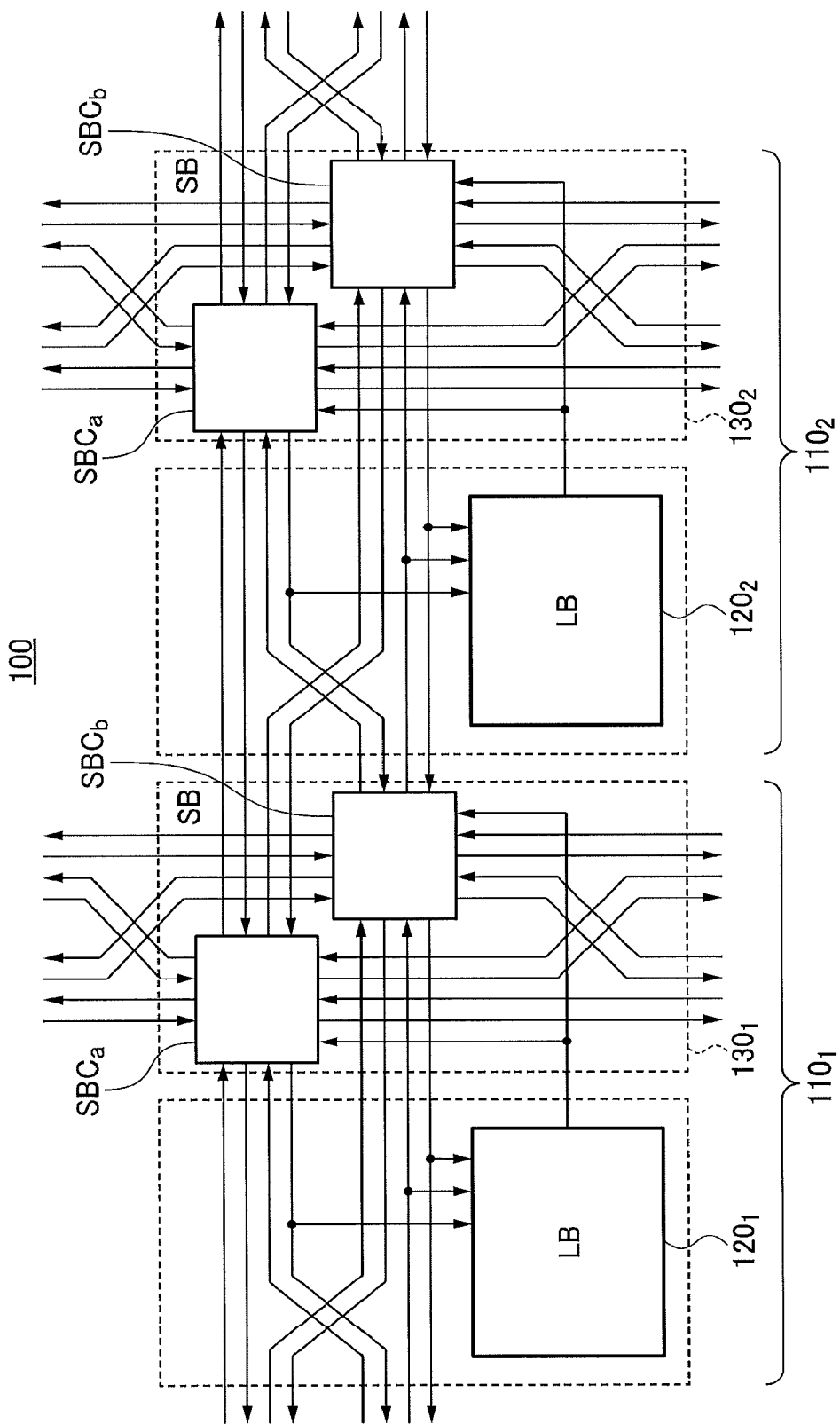
FIG. 11 is a block diagram showing an integrated circuit according to a first embodiment.

An integrated circuit according to the first embodiment is illustrated in FIG. 11. The integrated circuit of this first embodiment includes basic blocks $110_1$ and $110_2$. Each basic block $110_i$ (i=1, 2) includes a logic block $120_i$ and a switch block $130_i$. Each of the switch blocks $130_1$ and $130_2$ is divided into switch block circuits SBCa and SBCb.

For example, as illustrated in FIG. 6, each of the switch block circuits SBCa and SBCb includes a switching circuit including a plurality of switching elements $10_{11}$ to $10_{22}$ arrayed in a matrix.

In this first embodiment, unlike an integrated circuit with divided switch blocks which circuit is illustrated in FIG. 9 or FIG. 10, each of switch block circuits SBCa and SBCb divided in a certain switch block such as the switch block $130_2$ is connected to a switch block circuit SBCa and a switch block circuit SBCb, which are divided in a different switch block $130_1$, through a wiring line. Also, each of switch block circuits SBCa and SBCb is connected to a logic block $120_i$ in a basic block $110_i$, to which these switch block circuits SBCa and SBCb belong, through a wiring line. Note that it is individually designed how many wiring lines are connected from one of switch block circuits, which are divided in a certain switch block, to each of switch block circuits in a different switch block. An input from a wiring line into a logic block is arbitrarily selected and connected for the number of inputs of the logic block.

With such a configuration, it is possible to use a wiring resource effectively. This will be described with reference to FIG. 12.

In the integrated circuit 100 illustrated in FIG. 9 or FIG. 10, when an input signal S1 from the switch block circuit SBCa accesses a target logic block $120_1$, an input signal S2 cannot access the logic block $120_1$.

However, in the present embodiment, each switch block circuit in a certain switch block is in a connection relationship with all switch block circuits in a different switch block. Thus, with a switch block $130_i$ corresponding to a logic block $120_i$ of a basic block $110_i$ (i=1, 2), it is possible to perform an input into the logic block $120_i$ by selecting connection, which is from a switch block circuit where a signal passes to a target switch block circuit, in a different basic block. For example, a signal S2 from the switch block circuit SBCa of the basic block $110_2$ can be input into the logic block $120_1$ by selection of connection to the switch block circuit SBCb of the basic block $110_1$. This is because each switch block circuit has a cross point structure. That is, all inputs can be arbitrarily connected to all outputs. However, application is not possible in a case where a connectable wiring line is limited in each switch block circuit.

Note that in the present embodiment, switch block circuits divided in the same switch block are not connected to each other. This is because a crosspoint switch block becomes large and a delay is increased when there is connection with what is other than a wiring line of an FPGA.

Also, in the present embodiment, a special circuit only for connection between switch block circuits is not included and connection is made only with a wiring line. Accordingly, it is not possible to control an increase of a chip area.

As described above, according to the first embodiment, it is possible to provide an integrated circuit that can control a delay of a signal and an increase of a chip area.

Second Embodiment

In the integrated circuit 100 of the first embodiment illustrated in FIG. 11, a switch block in each basic block is divided into two switch block circuits.

When the number of wiring lines is increased, it is necessary to divide a switch block into more switch block circuits.

Figure 12:
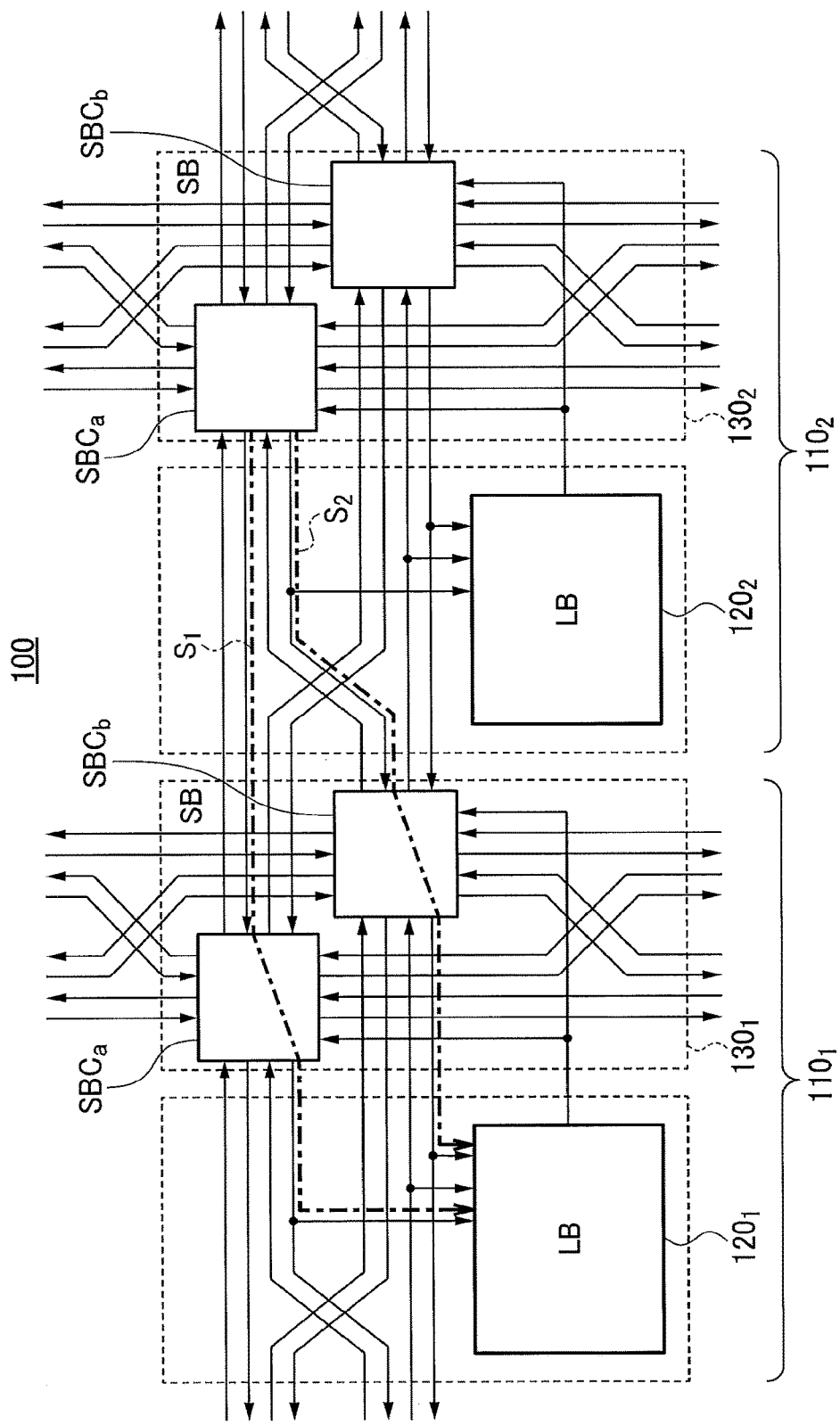
FIG. 12 is a block diagram for explaining an effect of the integrated circuit of the first embodiment.
Figure 13:
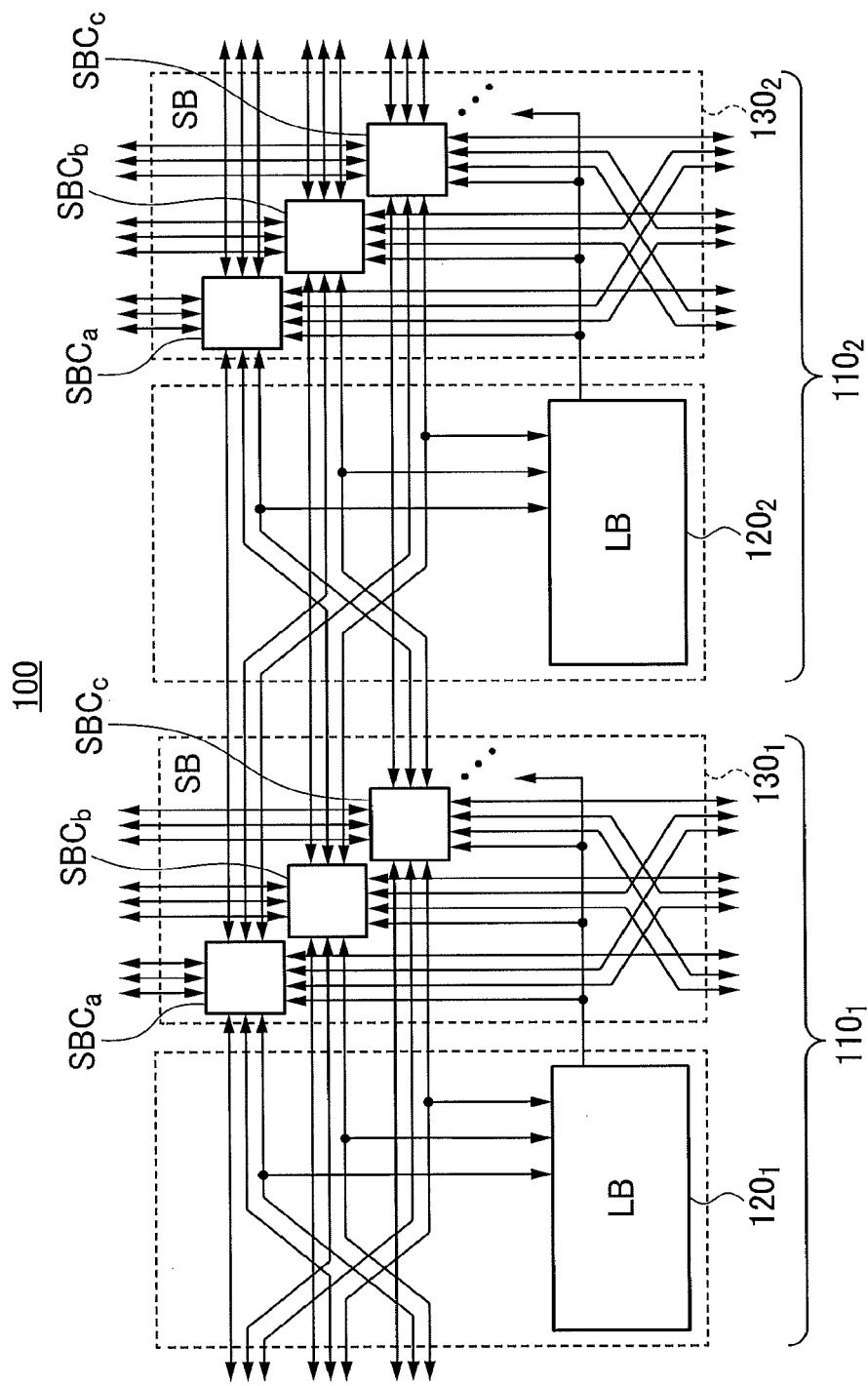
FIG. 13 is a block diagram showing an integrated circuit according to a second embodiment.

An integrated circuit according to the second embodiment is illustrated in FIG. 12. The integrated circuit 100 of this second embodiment is an integrated circuit in a case where each switch block is at least divided into three switch block circuits.

The integrated circuit 100 of this second embodiment includes basic blocks $110_1$ and $110_2$. Each basic block $110_i$ (i=1, 2) includes a logic block $120_i$ and a switch block $130_i$. Each of the switch blocks $130_1$ and $130_2$ is divided into switch block circuits SBCa, SBCb, and SBCc. For example, as illustrated in FIG. 6, each of the switch block circuits SBCa, SBCb, and SBCc includes a switching circuit 140 including a plurality of switching elements $10_{11}$ to $11_{22}$ arrayed in a matrix.

Similarly to the first embodiment, in the integrated circuit of this second embodiment, switch block circuits SBCa, SBCb, and SBCc divided in a certain switch block such as the switch block $130_2$ are respectively connected to a switch block circuit SBCa, a switch block circuit SBCb, and a switch block circuit SBCc divided in a different switch block $130_1$ through a wiring line. Also, each of the switch block circuits SBCa, SBCb, and SBCc is connected, through a wiring line, to a logic block $120_i$ in a basic block $110_i$ to which these switch block circuits SBCa, SBCb, and SBCc belong.

In the integrated circuit of the second embodiment configured in such a manner, all outputs of the logic block $120_i$ in the basic block $110_i$ (i=1, 2) are output to each of the switch block circuits SBCa, SBCb, and SBCc in the basic block $110_i$. Also, each of the switch block circuits SBCa, SBCb, and SBCc in the same basic block is mutually connected to each of switch block circuits SBCa, SBCb, and SBCc in a different basic block through a wiring line. Accordingly, even when a signal is input into a switch block circuit in a certain switch block, it is possible to output the signal to a switch block circuit in a different switch block.

As described above, according to the second embodiment, similarly to the first embodiment, it is possible to provide an integrated circuit that can control a delay of a signal and an increase of a chip area.

(Modification)

Figure 14:
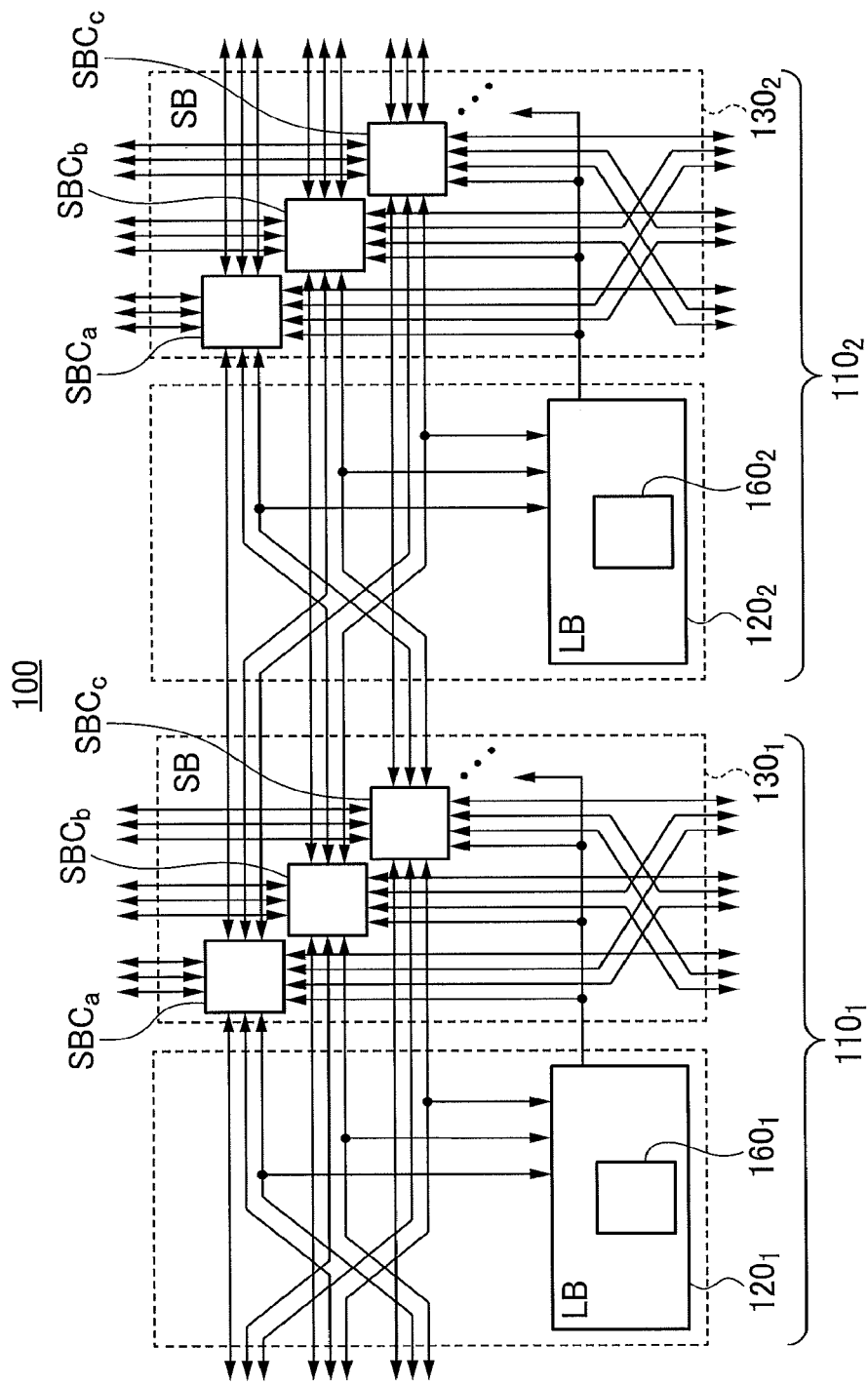
FIG. 14 is a block diagram showing an integrated circuit according to a modification of the first embodiment.

An integrated circuit according to a modification of the second embodiment is illustrated in FIG. 14. In the integrated circuit 100 of this modification, each logic block $120_i$ (i=1, 2) includes a circuit $160_i$ having a configuration identical to those of the switch block circuits SBCa, SBCb, and SBCc in the integrated circuit of the second embodiment.

For example, as illustrated in FIG. 6, the circuit $160_i$ (i=1, 2) includes a switching circuit including switching elements $10_{11}$ to $10_{22}$ arrayed in a matrix. Each of these circuits $160_1$ and $160_2$ performs, for example, connection between LUT circuits of a plurality of logic blocks, connection between hard macros, mutual connection between FFs, and/or the like.

Similarly to the second embodiment, the integrated circuit of this modification can provide an integrated circuit that can control a delay of a signal and an increase of a chip area.

Third Embodiment

With respect to each of the integrated circuits in the first and second embodiments and a modification thereof, connection between switch block circuits in switch blocks in adjacent basic blocks has been described. However, connection is not necessarily between adjacent basic blocks. This will be described as the third embodiment.

Figure 15:
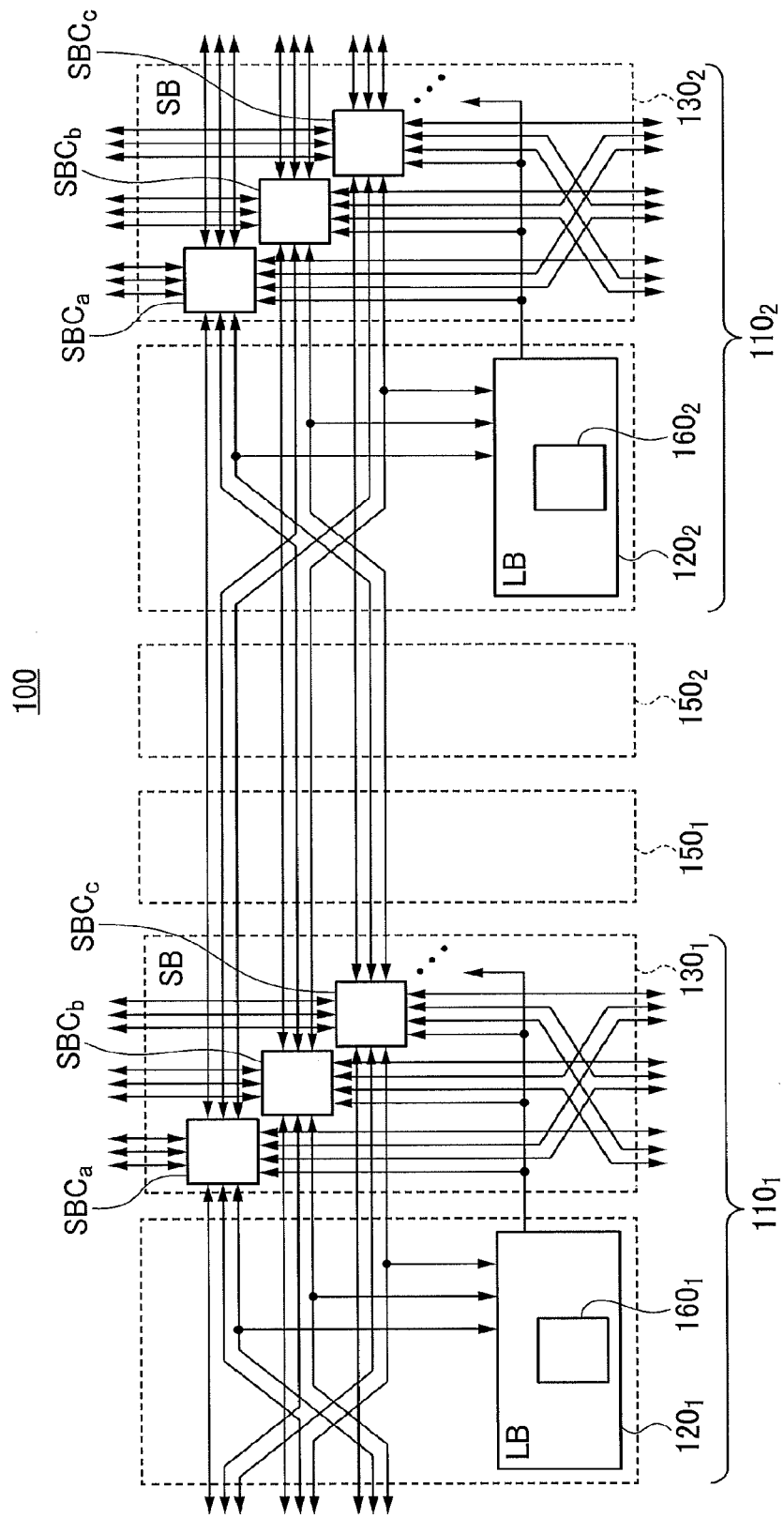
FIG. 15 is a block diagram showing an integrated circuit according to a third embodiment.

An integrated circuit of the third embodiment is illustrated in FIG. 15. The integrated circuit 100 of this third embodiment includes, in the integrated circuit of the modification of the second embodiment illustrated in FIG. 14, at least one block $150_1$ or $150_2$ arranged between a basic block $110_1$ and a basic block $110_2$. Each of these blocks $150_1$ and $150_2$ may be the same basic block or a block, which has a different function, such a block random access memory (RAM) or a digital signal processor (DSP).

Similarly to the modification of the second embodiment, the integrated circuit of this third embodiment can provide an integrated circuit that can control a delay of a signal and an increase of a chip area.

Fourth Embodiment

Figure 16:
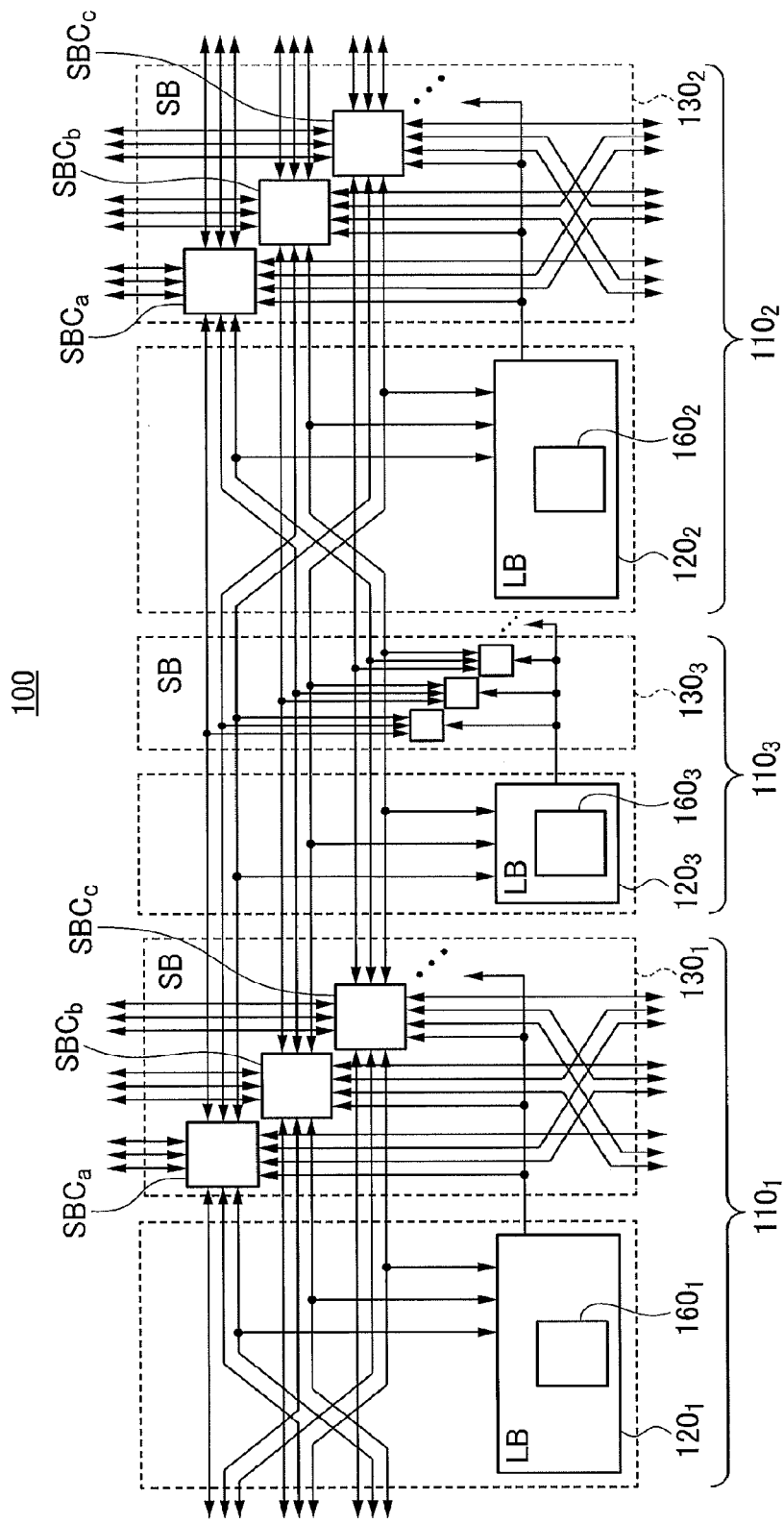
FIG. 16 is a block diagram showing an integrated circuit according to a fourth embodiment.
Figure 17:
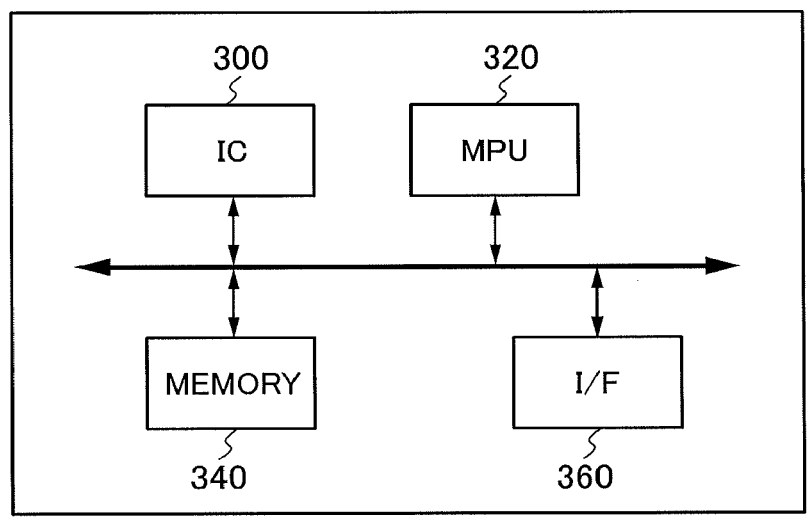
FIG. 17 is a block diagram showing an integrated circuit according to a fifth embodiment.

When all circuits have the configuration illustrated in FIG. 14, passage through two switch block circuits is necessary for connection with a block that is two blocks away. When two switch blocks include connection across two or more different switch blocks, a delay is increased for the passage. As an integrated circuit that solves this, an integrated circuit according to the fourth embodiment is illustrated in FIG. 16.

The integrated circuit 100 of this fourth embodiment includes a configuration in which a block arranged between a basic block $110_1$ and a basic block $110_2$ is a basic block $110_3$ in the integrated circuit of the third embodiment. Then, this basic block $110_3$ includes a logic block $120_3$ and a switch block $130_3$. In the logic block $120_3$, a circuit $160_3$ having a configuration identical to those of circuits $160_1$ and $160_2$ of logic blocks $120_1$ and $120_2$ in the basic blocks $110_1$ and $110_2$ is arranged. The logic block $120_3$ is connected to each of switch block circuits SBCa, SBCb, and SBCc in each of the different basic blocks $110_1$ and $110_2$ through a wiring line. The switch block $130_3$ is connected to each of the switch block circuits SBCa, SBCb, and SBCc in each of the different basic blocks $110_1$ and $110_2$ through a wiring line and is connected to a switch block circuit in a basic block different from the different basic blocks $110_1$ and $110_2$ through a wiring line (not illustrated). With such a circuit configuration, connection between the basic blocks $110_1$ and $110_2$ that are two blocks away from each other becomes possible only with a pass delay in switch block circuits SBCa, SBCb, and SBCc in switch blocks $130_1$ and $130_2$ and a delay is decreased compared to a case of passing through two switch block circuits.

Similarly to the third embodiment, the integrated circuit of this fourth embodiment can provide an integrated circuit that can control a delay of a signal and an increase of a chip area.

Note that in each of the first to fourth embodiments and modifications thereof, a case where connection between switch block circuits is in a horizontal direction on a plane of paper has been described. However, the connection may be in a vertical direction.

Fifth Embodiment

An electronic device according to the fifth embodiment is illustrated in FIG. 19. The electronic device of the fifth embodiment includes a circuit 300 including the integrated circuit of any of the first to fourth embodiments and modifications thereof, a microprocessor (hereinafter, also referred to as micro-processing unit (MPU)) 320, a memory 340, and an interface (I/F) 360, these configuration elements being connected to each other through a bus line 380.

The MPU 320 operates according to a program. In the memory 340, a program for operation of the MPU 320 is previously stored. The memory 340 is also used as a work memory of when the MPU 320 operates. The I/F 360 performs communication with an external device according to control by the MPU 320.

With this fifth embodiment, an effect similar to those of the first to fourth embodiments and modifications thereof can be acquired.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrated circuit comprising:
    a first block including a first logic block configured to perform a logical operation, a first switch block circuit configured to control connection and non-connection with the first logic block, and a second switch block circuit configured to control connection and non-connection with the first logic block;
    a second block including a second logic block configured to perform a logical operation, a third switch block circuit configured to control connection and non-connection with the second logic block, and a fourth switch block circuit configured to control connection and non-connection with the second logic block; and
    a third block arranged between the first block and the second block,
    wherein the first switch block circuit is mutually connected with the third and fourth switch block circuits, and
    the second switch block circuit is mutually connected with the third and fourth switch block circuits, and
    wherein the third block includes a third logic block configured to perform a logical operation, and
    the third logic block is connected to one output terminal of each of the first to fourth switch block circuits.

2. The integrated circuit according to claim 1, wherein the first switch block circuit and the second switch block circuit are not connected to each other in the first block, and
    the third switch block circuit and the fourth switch block circuit are not connected to each other in the second block.

3. The integrated circuit according to claim 1, wherein at least one of the first logic block and the second logic block includes a switching circuit,
    the switching circuit includes a plurality of first input terminals and a plurality of first output terminals, and
    each of the plurality of first input terminals is connected to one of the plurality of first output terminals.

4. The integrated circuit according to claim 1, wherein each of the first to fourth switch block circuits includes a plurality of input terminals and a plurality of output terminals, and
    each of the plurality of input terminals is connected to one of the plurality of output terminals.

5. The integrated circuit according to claim 1, wherein each of the first to fourth switch block circuits includes two-terminal switching elements arrayed in a matrix.

6. An electronic device comprising:
    the integrated circuit according to claim 1;
    a memory that stores a program; and
    a processor configured to execute processing on the integrated circuit according to the program stored in the memory.

7. An integrated circuit comprising:
    a first block including; a first logic block configured to perform a logical operation, a first switch block circuit including a plurality of first input terminals and a plurality of first output terminals, each of the plurality of first input terminals being connected to one of the plurality of first output terminals, and at least one of the plurality of first input terminals and at least one of the plurality of first output terminals being connected to the first logic block, and a second switch block circuit which includes a plurality of second input terminals and a plurality of second output terminals, each of the plurality of second input terminals being connected to one of the plurality of second output terminals, and at least one of the plurality of second input terminals and at least one of the plurality of second output terminals being connected to the first logic block, and a second block including; a second logic block configured to perform a logical operation, a third switch block circuit including a plurality of third input terminals and a plurality of third output terminals, each of the plurality of third input terminals being connected to one of the plurality of third output terminals, and at least one of the plurality of third input terminals and at least one of the plurality of third output terminals being connected to the second logic block, and a fourth switch block circuit including a plurality of fourth input terminals and a plurality of fourth output terminals, each of the plurality of fourth input terminals being connected to one of the plurality of fourth output terminals, and at least one of the plurality of fourth input terminals and at least one of the plurality of fourth output terminals being connected to the second logic block, wherein at least one of the plurality of first input terminals is connected to one of the plurality of third output terminals and at least one of others of the plurality of first input terminals is connected to one of the plurality of fourth output terminals, at least one of the plurality of first output terminals is connected to one of the plurality of third input terminals and at least one of others of the plurality of first output terminals is connected to one of the plurality of fourth input terminals, at least one of the plurality of second input terminals is connected to one of the plurality of third output terminals and at least one of others of the plurality of second input terminals is connected to one of the plurality of fourth output terminals, and at least one of the plurality of second output terminals is connected to one of the plurality of third input terminals and at least one of others of the plurality of second output terminals is connected to one of the plurality of fourth input terminals.

8. The integrated circuit according to claim 7, wherein each of the first to fourth switch block circuits includes two-terminal switching elements arrayed in a matrix.

* * * * *